United States Patent
Griffin

(10) Patent No.: US 8,766,432 B2
(45) Date of Patent: Jul. 1, 2014

(54) DEVICE WITH SEMICONDUCTOR DIE ATTACHED TO A LEADFRAME

(75) Inventor: Garrett Griffin, Limerick (IE)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 13/344,302

(22) Filed: Jan. 5, 2012

(65) Prior Publication Data

US 2012/0098113 A1    Apr. 26, 2012

Related U.S. Application Data

(62) Division of application No. 11/999,303, filed on Dec. 5, 2007, now Pat. No. 8,105,880.

(51) Int. Cl.
*H01L 23/14* (2006.01)
*H01L 23/495* (2006.01)

(52) U.S. Cl.
USPC ................ 257/701; 257/783; 257/E23.007

(58) Field of Classification Search
USPC .................................................. 257/E23.005
See application file for complete search history.

(56) References Cited

U.S. PATENT DOCUMENTS

| | | | |
|---|---|---|---|
| 4,897,508 A | 1/1990 | Mahulikar et al. | |
| 4,943,843 A | 7/1990 | Okinaga et al. | |
| 4,987,474 A | 1/1991 | Yasuhara et al. | |
| 5,140,404 A | 8/1992 | Fogal et al. | |
| 5,177,032 A | 1/1993 | Fogal et al. | |
| 5,286,679 A | 2/1994 | Farnworth et al. | |
| 5,304,842 A | 4/1994 | Farnworth et al. | |
| 5,367,196 A | 11/1994 | Mahulikar et al. | |
| 5,536,970 A * | 7/1996 | Higashi et al. | 257/676 |
| 5,541,446 A | 7/1996 | Kierse | |
| 5,609,956 A | 3/1997 | Sakumoto et al. | |
| 5,929,514 A | 7/1999 | Yalamanchili | |
| 6,012,502 A | 1/2000 | VanNortwick et al. | |
| 6,204,093 B1 | 3/2001 | Ahmad | |
| 6,545,343 B2 | 4/2003 | Brooks et al. | |
| 6,590,277 B1 | 7/2003 | King et al. | |

(Continued)

OTHER PUBLICATIONS

Written Opinion of the International Search Authority of Jun. 5, 2010 in International Application No. PCT/IE2008/000117, filed on Dec. 3, 2008 in 8 pages.

*Primary Examiner* — Stephen W Smoot

(74) *Attorney, Agent, or Firm* — Knobbe, Martens, Olson & Bear, LLP

(57) ABSTRACT

Methods and resulting devices are disclosed related to attaching a die to a leadframe. One such method includes initially bonding a carrier pad which is pre-coated with a thermosetting first adhesive to the leadframe. The carrier pad can be electrically non-conductive. The first adhesive can be raised to its thermosetting cure temperature by heating the leadframe to a temperature just above the thermosetting cure temperature of the first adhesive. A thermosetting second adhesive which is liquid at room temperature can be applied to a second major surface of the carrier pad, and the die can be placed on the second adhesive and aligned with the leadframe. The second adhesive can be raised to its thermosetting cure temperature to bond the die to the carrier pad, and in turn form a bonded assembly.

19 Claims, 9 Drawing Sheets

(56) References Cited

U.S. PATENT DOCUMENTS

| | | |
|---|---|---|
| 6,706,559 B2 | 3/2004 | Jiang et al. |
| 6,787,396 B2 | 9/2004 | Grigg et al. |
| 6,818,460 B2 | 11/2004 | Moden et al. |
| 6,864,153 B2 | 3/2005 | Reeder et al. |
| 6,894,372 B2 | 5/2005 | Corisis et al. |
| 2001/0050422 A1 | 12/2001 | Kishimoto |
| 2002/0037372 A1 | 3/2002 | Sato et al. |
| 2003/0122226 A1* | 7/2003 | Cobbley et al. ............... 257/678 |
| 2005/0156292 A1 | 7/2005 | Paek |
| 2007/0158792 A1 | 7/2007 | Camacho et al. |

* cited by examiner

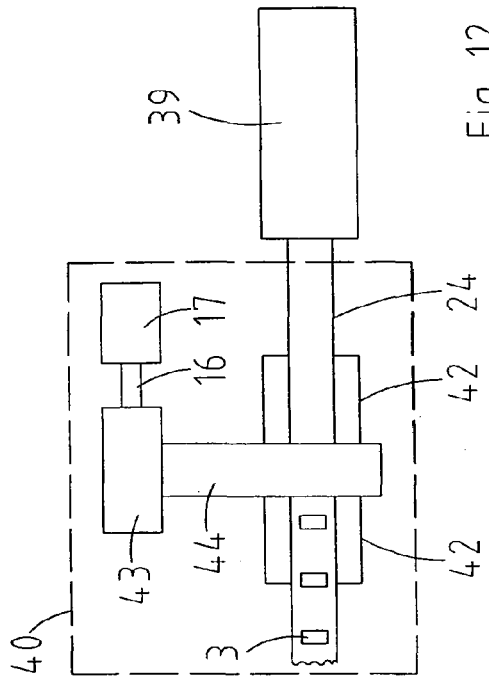
Fig. 12
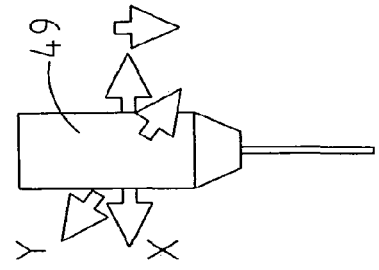
Fig. 14
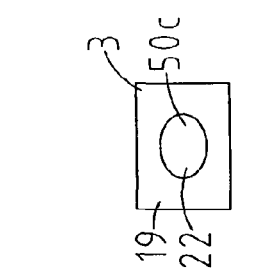
Fig. 17
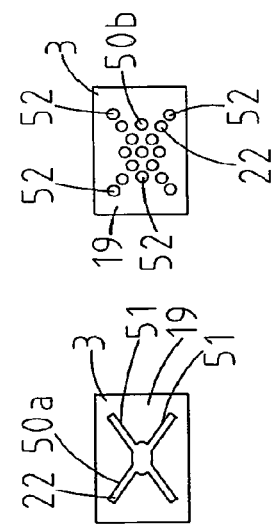
Fig. 16
Fig. 15
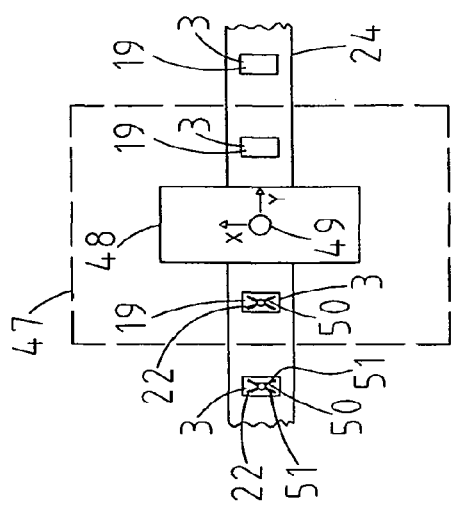
Fig. 13

DEVICE WITH SEMICONDUCTOR DIE ATTACHED TO A LEADFRAME

CROSS-REFERENCE TO RELATED APPLICATIONS

This application is a divisional of U.S. patent application Ser. No. 11/999,303, filed Dec. 5, 2007, now U.S. Pat. No. 8,105,880, titled METHOD FOR ATTACHING A SEMICONDUCTOR DIE TO A LEADFRAME, AND A SEMICONDUCTOR DEVICE, which is hereby incorporated herein by reference in its entirety.

FIELD OF THE INVENTION

The present invention relates to a method for attaching a semiconductor die to a leadframe, and the invention also relates to a semiconductor device comprising a semiconductor die attached to a leadframe.

BACKGROUND TO THE INVENTION

Such semiconductor devices comprise a semiconductor die and a leadframe comprising a plurality of leads which are wire bonded to corresponding electrically conductive contact pads of the die. The die and portions of the leads of the leadframe are encapsulated in an encapsulating housing formed from a mouldable compound, typically, a thermosetting material, such as epoxy resins, with distal portions of the leads of the leadframe extending through the encapsulating housing for facilitating electrical coupling of the semiconductor device to other components, for example, for facilitating electrical coupling of the semiconductor device to a printed circuit board using various types of solder coupling technologies including surface-mount technology and other more conventional technologies. In the manufacture of such semiconductor devices, it is important that the die and the leadframe are secured together prior to wire bonding of the contact pads of the die to the leads of the leadframe. Various methods for securing a die to a leadframe prior to wire bonding of the contact pads of the die to the leads of the leadframe are known.

For example, U.S. Pat. No. 5,541,446 of Kierse granted to the assignee of the present Application discloses a leadframe comprising a plurality of leads, proximal ends of which extend beneath a die, and the die is bonded directly to the leads by an electrically non-conductive adhesive. Subsequent to bonding of the die to the leadframe, the electrically conductive contact pads of the die are wire bonded to the corresponding leads of the leadframe, and the assembly is then encapsulated in a mouldable compound. The leadframe is then subsequently trimmed in order to electrically isolate the leads from each other. However, a problem of the method disclosed in U.S. Pat. No. 5,541,446 is that the die must first be coated with the adhesive, which typically is an epoxy adhesive paste. The coating and subsequent handling of dies so coated is difficult and requires specialised coating and die handling machines.

U.S. Pat. No. 4,943,843 of Okinaga, et al discloses a number of embodiments and methods for encapsulated semiconductor devices. In one of the semiconductor devices, the device comprises a die and a leadframe with an electrically non-conductive pad disposed between and bonded to the die and the leadframe by respective adhesives which are disposed between the non-conductive pad and the leadframe, and between the non-conductive pad and the die. The specification of Okinaga is silent on the type of adhesives, however, the adhesives appear to be provided as sheets of thermoplastic adhesives, which are subsequently heated to effect bonding. A problem of this method is that alignment of the die relative to the leadframe for aligning the electrically conductive contact pads of the die with the corresponding leads of the leadframe is difficult. Another problem associated with the method of Okinaga is that due to the fact that the wire bonding to some of the leads of the leadframe has to be effected at the extreme proximal ends of the leads, where the extreme proximal ends of the leads extend just beyond the non-conductive pad and the die. This only allows a relatively small area at the extremities of the proximal ends of such leads available for wire bonding, and adhesive may seep from beneath the carrier pad along such leads to their respective proximal extremities, thus preventing adequate electrical contact between the bond wires and the leads. In another embodiment of the method disclosed in the specification of Okinaga, a die of an encapsulated semiconductor device is directly bonded to the leadframe by an electrically non-conductive adhesive which appears to be a thermoplastic adhesive, examples of which are given as polyimide resins, silicon rubbers and ceramics.

U.S. Pat. No. 4,987,474 of Yasuhara discloses an encapsulated semiconductor device comprising a die and a leadframe with an electrically non-conductive pad disposed between and bonded to the die and the leadframe. The non-conductive pad is a polyimide type resin film. The leadframe is bonded to the non-conductive pad by a layer of thermoplastic adhesive such as a polyester amidoimide, and the die is bonded to the non-conductive pad by a bonding layer which is formed by a multi-layer non-conductive adhesive such as silicon rubber, epoxy rubber, epoxy type resin or polyimide type resin stacked on a thermosetting polyimide type resin adhesive. A problem with this method is that alignment of the die with the leadframe for aligning the electrically conductive contact pads of the dies with the corresponding leads of the leadframe is difficult.

U.S. Pat. No. 5,140,404 of Fogal discloses two methods for securing a die to a leadframe prior to wire bonding electrically conductive contact pads of the die to corresponding leads of the leadframe. In one of the methods the die is attached to a die paddle of the leadframe with an adhesive such as an epoxy paste, an epoxy film, metal or glue. In the other of the methods the die paddle is replaced with a tape which appears to be electrically non-conductive, and the tape is attached to proximal ends of leads of the leadframe, and the die is attached to the tape. The tape is layered on one or both sides thereof with a thermoplastic material, depending on whether the die and the leads of the leadframe are to be attached to the same side, or to respective opposite sides of the tape. The thermoplastic material is provided instead of adhesive for attaching the die and the leadframe to the tape. A problem with this latter method is that it is difficult to align the die and the leadframe for alignment of the electrical conductive contact pads of the die with the corresponding leads of the leadframe. Additionally, the die and the leadframe must be simultaneously attached to the tape which leads to further problems of aligning the die and the leadframe.

U.S. Pat. No. 5,304,842 of Farnworth, et al discloses a method for securing a die to a leadframe which requires locating a carrier material such as polyimide between the leadframe and the die, and attaching the die and the leadframe to the carrier. A layer of thermoplastic adhesive is disposed between the carrier and the leadframe, and a layer of thermoplastic adhesive is disposed between the carrier and the die. The layer of adhesive between the carrier and the die is selected so that it softens and flows at a lower temperature than the layer of adhesive disposed between the carrier and the leadframe. In this way the carrier can be secured to the leadframe, and then subsequently to the die. However, this method also suffers from the problem that alignment of the die with the leadframe is difficult.

U.S. Pat. No. 6,706,559 of Jiang, et al also discloses a method for securing a die to a leadframe prior to wire bonding of electrically conductive contact pads of the die to the leads of the leadframe. In the method of Jiang a wet film adhesive layer is disposed between the die and the leadframe, and the adhesive may be applied to the die or to the leadframe, or to both. Examples of adhesives are liquid or paste mixtures of unreacted monomers, polymers or diluted resins, polyimides or polyimide siloxane. The adhesive is then subsequently cured.

Accordingly, in general, all such prior art methods either require a film of adhesive to be disposed between the semiconductor die and the leadframe or a die paddle for directly securing the die to the leadframe or paddle, or alternatively, prior art methods require a sheet of material, typically, an electrically non-conductive sheet to be disposed between and attached to the die and the leadframe by respective layers of adhesive. Additionally, in prior art methods the adhesives used to bond the semiconductor die to the leadframe or to the die paddle, or to bond the die to the electrically non-conductive sheet, and to bond the electrically non-conductive sheet to the leadframe are typically thermoplastic adhesives. Thermoplastic adhesives, while they remain stable at room temperature after curing, are not stable at higher temperatures, and after curing become unstable at temperatures in the region of their normal melt, cure and bond temperatures. Thus, in virtually all cases the bonding of the non-conductive sheet to the leadframe and to the die must be carried out simultaneously. This causes considerable problems in the assembly of the leadframe, the non-conductive sheet and the die, since the leadframe, the non-conductive sheet and the die must be accurately and correctly positioned and aligned relative to each other prior to subjecting the assembly to an appropriate temperature for raising the thermoplastic adhesives to a temperature sufficient for effecting bonding of the die and the leadframe to the non-conductive sheet. Maintaining the die, the leadframe and the non-conductive sheet accurately aligned and positioned during this procedure is difficult.

However, even in the method disclosed in U.S. Pat. No. 5,304,842 of Farnworth, which permits sequential bonding of the leadframe and the die to the carrier pad, the problem of alignment of the die with the leadframe still exists.

There is therefore a need for a method for attaching a semiconductor die to a leadframe which addresses at least some of the problems of the prior art methods and which facilitates handling of the die and the leadframe and in particular alignment of the die with the leadframe.

The present invention is directed towards providing such a method, and the invention is also directed towards providing a semiconductor device with an encapsulated bonded assembly of a die and a leadframe.

SUMMARY OF THE INVENTION

According to the invention there is provided a method for attaching a semiconductor die to a leadframe, the method comprising:

providing the leadframe with a carrier pad attached thereto, the carrier pad having first and second major surfaces, and a first adhesive bonding the leadframe to the first major surface of the carrier pad, applying a flowable temperature curable second adhesive to the second major surface of the carrier pad, placing the die on the second adhesive on the second major surface of the carrier pad for facilitating wire bonding of the die to the leadframe, and subjecting the second adhesive to a curing temperature for curing thereof to bond the die to the carrier pad.

In one aspect of the invention the second adhesive is applied to the second major surface of the carrier pad by dispensing the second adhesive through a nozzle, and preferably, the second adhesive is dispensed through the nozzle so that the second adhesive forms a pattern on the second major surface of the carrier pad. Advantageously, the nozzle is moved during dispensing of the second adhesive therefrom in a common plane of movement in at least one of an X-axis direction and a Y-axis direction for applying the second adhesive on the second major surface of the carrier pad in the form of the pattern.

In one aspect of the invention the second adhesive is continuously dispensed through the nozzle while the nozzle is being moved in the at least one of the X- and Y-axes directions to form the pattern of the second adhesive as a continuous pattern on the second major surface of the carrier pad. Alternatively, dispensing of the second adhesive through the nozzle is periodically disrupted while the nozzle is being moved in the at least one of the X- and Y-axes directions form the pattern of the second adhesive as a discontinuous pattern comprising a plurality of discrete portions of the adhesive.

In one aspect of the invention the nozzle is adapted for forming the pattern of the second adhesive as a line pattern as the nozzle is being moved in the at least one of the X- and Y-axes directions. Preferably, the nozzle is simultaneously moved in the common plane of movement in both the X-axis direction and the Y-axis direction during dispensing of the second adhesive therefrom.

Preferably, the common plane of movement of the nozzle in the X- and Y-axes directions lies substantially parallel to a plane defined by the second major surface of the carrier pad.

In another aspect of the invention the die is manoeuvred on the second adhesive on the second major surface of the carrier pad for aligning electrically conductive contact pads of the die with corresponding leads of the leadframe for facilitating subsequent wire bonding of contact pads of the die and the leads of the leadframe, and preferably, the die is pressed into engagement with the second adhesive on the second major surface of the carrier pad.

Preferably, the second adhesive is a thermosetting adhesive, and advantageously, is an electrically non-conductive adhesive.

In another aspect of the invention the second adhesive has a cure temperature in the range of 80° C. to 250° C., and preferably, the second adhesive has a cure temperature in the range of 120° C. to 200° C., and ideally, the second adhesive has a cure temperature of approximately 175° C.

In a further aspect of the invention the second adhesive is flowable at room temperature, and preferably, is liquid at room temperature. Advantageously, the second adhesive is an adhesive sold under the trade name ABLESTIK 84-3J.

Preferably, the carrier pad is of an electrically non-conductive material, and advantageously, is of a flexible electrically non-conductive material.

Advantageously, the carrier pad is of polyimide material, which preferably, is stable at the cure temperature of the second adhesive.

In another aspect of the invention the area of the carrier pad in plan view is substantially similar to the area of the die in plan view. Preferably, the die and the carrier pad are attached to the leadframe so that the die overlays a proximal portion of at least some of the leads of the leadframe, and preferably, the die overlays proximal ends of at least some of the lead of the leadframe. Advantageously, the die and the carrier pad are attached to the leadframe so that the die overlays the proximal portion of all the leads of the leadframe, and ideally, the die overlays the proximal ends of all of the leads of the leadframe.

In one aspect of the invention the die comprises a first major surface adjacent which an integrated circuit is formed therein, and a second major surface remote from the integrated circuit and defined by a substrate on which the integrated circuit is formed, and the die is placed on the second adhesive with one of the first and second major surfaces of the die abutting the second adhesive.

In another aspect of the invention the method further comprises wire bonding the die to the leadframe, and preferably, the method comprises the further step of encapsulating the die, the leadframe and the carrier pad bonded together in an encapsulating housing of a mouldable thermosetting material, with distal ends of the leads of the leadframe extending from the encapsulating housing.

In one aspect of the invention the first adhesive is a temperature curable adhesive. Preferably, the first adhesive has a cure temperature in the range of 120° C. to 250° C. Advantageously, the first adhesive has a cure temperature in the range of 190° C. to 210° C. Ideally, the first adhesive has a cure temperature of approximately 200° C.

In one aspect of the invention the first adhesive is a thermosetting adhesive, and preferably, is an electrically non-conducting adhesive.

Preferably, the first adhesive is pre-coated onto the first major surface of the carrier pad, and advantageously, is partially cured thereon, and in another aspect of the invention the first adhesive is partially cured during coating onto the first major surface of the carrier pad.

In another aspect of the invention the method further comprises bonding the carrier pad to the leadframe, and preferably, the carrier pad is bonded to the leadframe prior to bonding the die to the carrier pad.

Advantageously, the carrier pad is placed on the leadframe with the first adhesive on the first major surface thereof abutting the leadframe, and preferably, the leadframe is heated for in turn at least partially curing the first adhesive, and advantageously, the leadframe is heated prior to placing the carrier pad on the leadframe.

In another aspect of the invention the first adhesive is subjected to a curing temperature for curing thereof to bond the carrier pad to the leadframe, and preferably, the leadframe is heated to a temperature sufficient to raise the first adhesive to its cure temperature.

The invention also provides a semiconductor integrated circuit device prepared by the method according to the invention.

Additionally the invention provides a semiconductor device comprising:

a carrier pad having first and second major surfaces, a leadframe bonded to the first major surface of the carrier pad by a first adhesive, a semiconductor die bonded to the second major surface of the carrier pad by a second adhesive, the second adhesive being a flowable temperature curable adhesive, and having been applied to the second major surface of the carrier pad in flowable form for facilitating alignment of electrically conductive contact pads of the die with leads of the leadframe during placement of the die on the carrier pad.

Preferably, the carrier pad comprises a carrier pad pre-coated with the first adhesive on the first major surface thereof In one aspect of the invention the die comprises a first major surface adjacent which an integrated circuit is formed therein, and a second major surface remote from the integrated circuit defined by a substrate in which the integrated circuit is formed, the die being attached to the carrier pad with the second major surface of the die adjacent the second major surface of the carrier pad. Preferably, the die, the carrier pad and the leadframe bonded together are encapsulated in an encapsulating housing of a mouldable thermosetting material, and preferably, distal portions of the respective leads of the leadframe extend from the encapsulating housing.

Advantages of the Invention

The advantages of the invention are many. By virtue of the fact that the carrier pad is initially bonded and secured to the leadframe prior to bonding and securing the die to the carrier pad, once the carrier pad has been secured to the leadframe, the die can then be accurately aligned and positioned on the carrier pad relative to the leadframe, and then subsequently secured to the carrier pad in accurate alignment with the leadframe. Thus, in the method according to the invention it is no longer necessary to ensure accurate alignment of the die with the leadframe, before any bonding commences. Furthermore, by providing the second adhesive which bonds the die to the carrier pad as a flowable adhesive and in particular as an adhesive which is liquid at room temperature, the die can be easily positioned on the carrier pad and aligned with the leadframe, since the carrier had has already been secured to the leadframe by the first adhesive and therefore there is no danger of further movement of the carrier pad relative to the leadframe. Accordingly, the contact pads of the die can readily easily be accurately aligned with corresponding leads of the leadframe while the second adhesive is in the liquid form.

By providing the carrier pad pre-coated with the first adhesive on the first major surface thereof, the carrier pad can be readily easily secured initially to the leadframe. By initially securing the carrier pad to the leadframe, the die can be placed on and pressed into the second adhesive on the second major surface of the carrier pad, and then accurately aligned in X- and Y-axis directions with the leadframe so that the contact pads of the die are accurately aligned with the corresponding leads of the leadframe prior to curing of the second adhesive.

A further advantage is achieved when the second adhesive which is applied to the second major surface of the carrier pad is a thermosetting adhesive. Once a thermosetting adhesive has been cured, it is permanently cured and is unaffected by any further rises in temperature or temperature fluctuations, in other words, a thermosetting adhesive remains temperature stable once it has been cured. Therefore, the bonded assembly of the leadframe, the carrier pad and the die remain unaffected by any further temperature rises or fluctuations to which it may be subsequently subjected during coupling of the bond wires to the contact pads and to the leads of the leadframe, as well as during encapsulation of the bonded assembly in the encapsulating housing, and/or during use by an end user. A similar advantage is achieved when the first adhesive which is applied to the first major surface of the carrier pad is a thermosetting adhesive, and additionally, by providing the first adhesive as a thermosetting adhesive, once the first adhesive is cured during bonding of the carrier pad to the leadframe, the cured bond formed by the first adhesive between the carrier pad and the leadframe is unaffected during subsequent high temperature curing of the second adhesive for bonding the die to the second major surface of the carrier pad.

A further advantage of the method according to the invention is that it permits the bonding of the carrier pad to the leadframe to be carried out as a sub-assembly entirely independently and separately of securing the die to the carrier pad. Indeed, the sub-assembly of the leadframe and the carrier pad can be produced independently of, and indeed, on a separate production line to that of the bonding of the die to the carrier pad. For example, it is envisaged that a third party manufacturer who manufactures leadframes in elongated strips of leadframes which will be well known to those skilled in the art may carry out the operation of bonding the carrier pads to the leadframes of each strip of leadframes. In which case, the sub-assembly of the carrier pads bonded to the leadframes would be supplied in elongated strips, whereby each strip would include a plurality of leadframes with carrier pads bonded thereto. Such strips of leadframes and carrier pads could then be supplied to a separate manufacturer who would then bond the dies to the carrier pads on the leadframes.

A further advantage of providing the second adhesive in a flowable or liquid form at room temperature is that the second adhesive can be readily easily dispensed onto the second major surface of the carrier pad, and furthermore, the dispensing of the second adhesive onto the second major surface of the carrier pad can be accurately controlled, and in particular, the quantity and depth of the second adhesive dispensed onto the second major surface of the carrier pad can be accurately controlled. Indeed, by providing the second adhesive in flowable or liquid form, the second adhesive can readily easily be dispensed through a nozzle, and furthermore, by moving the nozzle in a common plane in respective X- and Y-axis directions, the second adhesive may be dispensed onto the second major surface of the carrier pad in any desired pattern, which may be a continuous pattern or an discontinuous pattern. This further enhances accurately determining the depth of the second adhesive located between the die and the second major surface of the carrier pad. The ability to accurately control the depth of the second adhesive between the die and the second major surface of the carrier pad is particularly advantageous where the second adhesive is an electrically non-conductive adhesive, and the non-conductive properties of the adhesive are being relied on, particularly, for example, in cases where the carrier pad may not be of an electrically non-conductive material, or the surface of the die which is bonded to the second major surface of the carrier pad is the surface adjacent the integrated circuit.

A further advantage of the invention is achieved by virtue of the fact that in the method according to the invention there is no longer a need for applying adhesive to either the leadframe or the die. Thus, both the leadframe and the die can readily easily be handled without the need for special purpose handling machinery, and in particular, special purpose pick-and-place machinery. Furthermore, by virtue of the fact that there is no longer a need to apply adhesives to the leadframe and the die, there is no danger of the leadframe or the die becoming stuck in pick-and-place apparatus of production machinery, which would otherwise result from the presence of adhesive on the leadframe and/or the die.

The invention and its many advantages will be readily apparent to those skilled in the art from the following description of a preferred embodiment thereof, which is given by way of example only, with reference to the accompanying drawings.

BRIEF DESCRIPTION OF THE DRAWINGS

FIG. 12 is a diagrammatic top plan view of a portion of apparatus for forming the semiconductor device of FIG. 1, FIG. 13 is a diagrammatic top plan view of another portion of the apparatus for forming the semiconductor device of FIG. 1, FIG. 14 is an elevational view of a detail of the portion of the apparatus of FIG. 13, FIGS. 15 to 17 are top plan views of a detail of the semiconductor device of FIG. 1.

DETAILED DESCRIPTION OF A PREFERRED EMBODIMENT OF THE INVENTION

Figure 1:
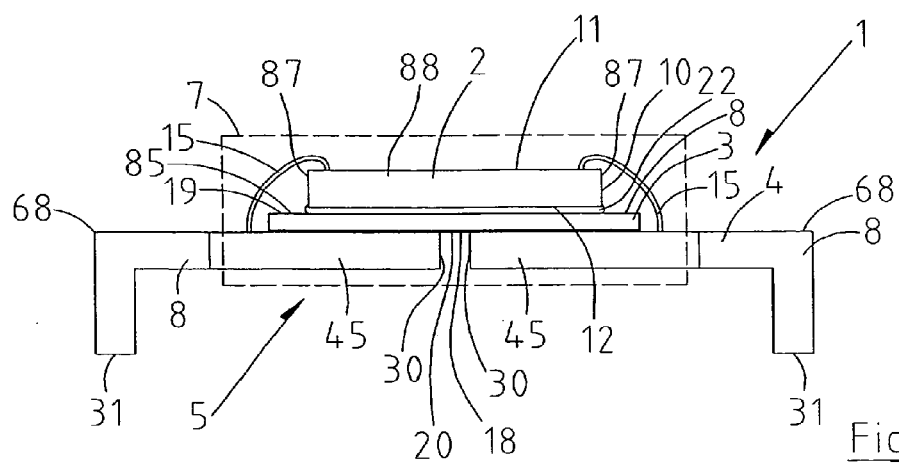
FIG. 1 is an end elevational view of a semiconductor device according to the invention.
Figure 10:
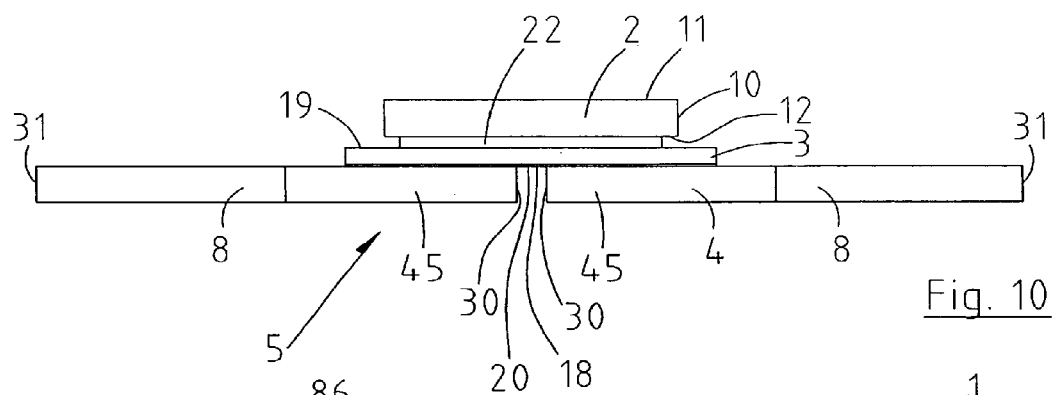
FIG. 10 is an end elevational view of the semiconductor device of FIG. 1 in a partly assembled state.
Figure 9:
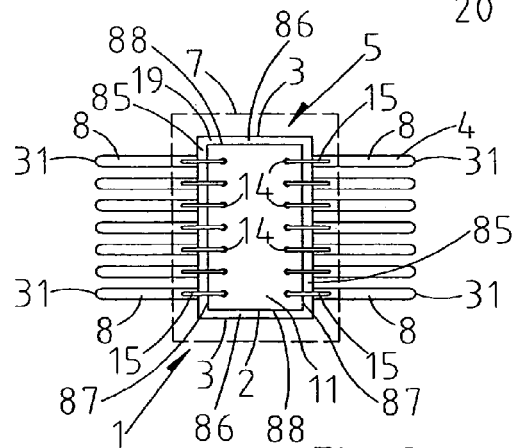
FIG. 9 is a top plan view of the portion of the semiconductor device of FIG. 3 also partly assembled.
Figure 2:
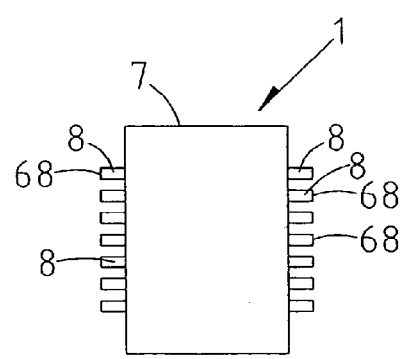
FIG. 2 is a top plan view of the semiconductor device of FIG. 1.

Referring to the drawings and in particular to FIGS. 1, 2, 9 and 10, there is illustrated a semiconductor device according to the invention, indicated generally by the reference numeral 1. The semiconductor device 1 comprises a semiconductor die 2 which is bonded to a carrier pad 3, which in turn is bonded to a leadframe 4 to form a bonded assembly 5, see Fits. 1 and 10. The bonded assembly 5 is encapsulated in an encapsulating housing 7 of a mouldable compound which is moulded around the bonded assembly 5. The encapsulating housing 7 is illustrated in broken lines in FIGS. 1 and 9 and in full lines in FIG. 2. Mutually insulated leads 8 of the leadframe 4 extend outwardly from the encapsulating housing 7 for electrically coupling the semiconductor device 1 to, for example, a printed circuit board (not shown).

The die 2 comprises an integrated circuit (not shown) formed on a substrate 10, which defines first and second major surfaces 11 and 12, respectively. The integrated circuit (not shown) is formed adjacent the first major surface 11, and electrically conductive contact pads 14 formed on the first major surface 11 are provided for addressing and writing data to and reading data from the integrated circuit (not shown). The fabrication of an integrated circuit on such a die, and the provision of electrically conductive contact pads for addressing and writing and reading data to and from the integrated circuit will be well known to those skilled in the art, and further explanation should not be required. Electrically conductive bond wires 15 electrically couple the contact pads 14 of the die 2 with corresponding leads 8 of the leadframe 4 for facilitating addressing and writing and reading data to and from the integrated circuit (not shown) of the die 2 through the leads 8 of the leadframe 4. The bond wires 15 are electrically coupled to the contact pads 14 and the corresponding leads 8 by thermosonic welding, as will be well known to those skilled in the art, and are located within the encapsulating housing 7.

The carrier pad 3 is of electrically non-conducting flexible polyimide material and is cut from a tape 16 of the polyimide material. The carrier pad 3 defines a first major surface 18 and a second major surface 19. The first major surface 18 is pre-coated with an electrically non-conducting thermosetting first adhesive 20 with a thermosetting cure temperature of approximately 200° C. for bonding the carrier pad 3 to the leadframe 4. In this embodiment of the invention the tape 16 forming the carrier pad 3 is pre-coated with the first adhesive 20, and is an adhesive coated tape sold under the trade name Elephane R-722. The tape 16 is supplied on a reel 17 from which the tape 16 is cut to the appropriate size to form the carrier pad 3, as will be described below with reference to FIG. 12. A release sheet (not shown) is attached to the surface of the first adhesive 20 on the tape 16 to protect the first adhesive. The release sheet (not shown) is removed from the tape 16 for exposing the first adhesive 20 prior to severing the carrier pad 3 from the tape 16 and placing the carrier pad 3 with the first adhesive 20 bonding the carrier pad 3 to the leadframe 4. A second electrically non-conducting thermosetting adhesive 22, which will be described below, is dispensed onto the second major surface 19 of the carrier pad 3 after the carrier pad 3 has been bonded to the leadframe 4 for bonding the second major surface 12 of the die 2 to the second major surface 19 of the carrier pad 3.

With the die 2, the carrier pad 3 and the leadframe 4 bonded together by the first and second adhesives 20 and 22 to form the bonded assembly 5, and with the bond wires coupling the contact pads 14 to the leads 8, the bonded assembly 5 is placed in a mould, and the encapsulating compound to form the encapsulating housing 7 is moulded around the bonded assembly 5. This process of encapsulating a bonded assembly 5 of a semiconductor device will be well known to those skilled in the art, and further description should not be required.

Figure 11:
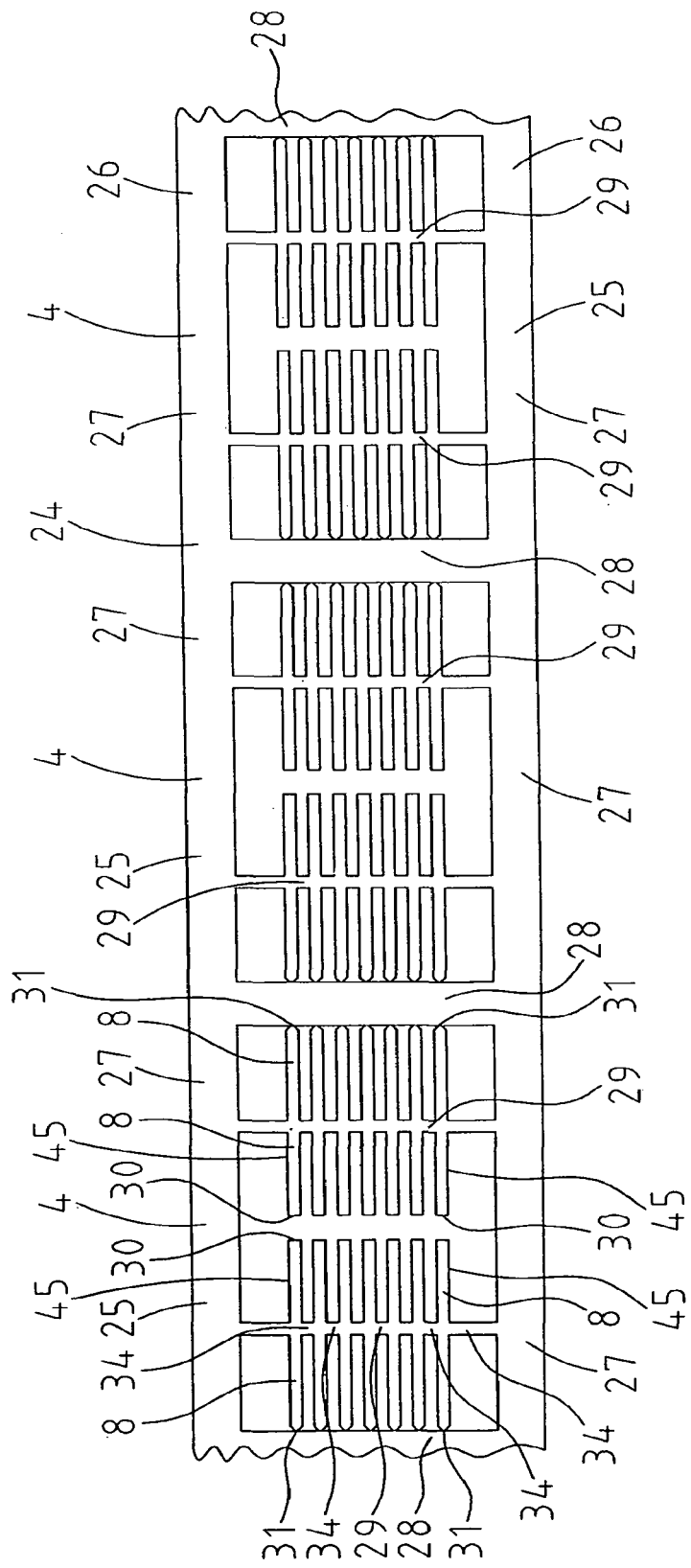
FIG. 11 is a top plan view of a strip of leadframes from which the semiconductor device of FIG. 1 is formed.

Turning now to the leadframe 4, the leadframe 4 is one of a plurality of leadframes 4 which are supplied in an elongated strip 24 of leadframes 4, see FIG. 11. A plurality of strips 24 of leadframes 4 are supplied and stacked in a magazine from which they are fed during assembly of the bonded assembly 5, as will be described below. The strips 24 forming the leadframes 4 are of an electrically conductive metal, which is typically copper alloy C-194. The leadframes 4 are located within respective frames 25 formed in the strip 24. A pair of spaced apart side members 26 extending longitudinally along opposite sides of the strips 24 of leadframes 4 form side members 27 of each frame 25. Spaced apart transverse members 28 extending transversely between the side members 26 form transverse members 28 of the frames 25. A pair of spaced apart inner transverse members 29 of each leadframe 4 extend between the side members 27 and are located within the transverse members 28 of the corresponding frame 25.

The leads 8 of each leadframe 4 extend from the inner transverse members 29 on opposite sides thereof, and on one side of the inner transverse members 29, the leads 8 terminate in free proximal ends 30, and on the other side of the inner transverse members 29, the leads 8 terminate in distal ends 31, which are attached to the adjacent transverse member 28. After the bonded assembly 5 has been formed and encapsulated in the encapsulating housing 7, interstices 34 formed by the inner transverse member 29 extending between the leads 8 of the leadframe 4 are removed for electrically isolating the leads 8 from each other, and the distal ends 31 of the leads 8 are severed from the outer transverse members 27. Severing of the interstices 34 between the side member 27 and the adjacent leads 8 finally severs the leads 8 and in turn the encapsulated bonded assembly 5 from the corresponding frame 25.

Figure 3:
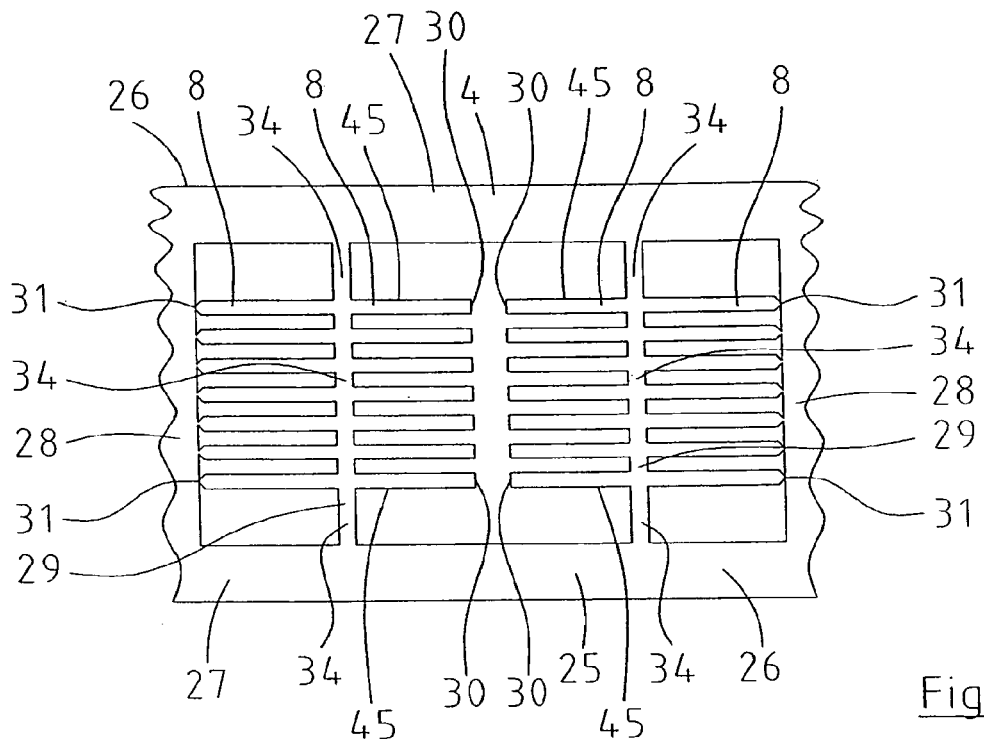
FIG. 3 is a top plan view of a portion of the semiconductor device of FIG. 1.
Figure 4:
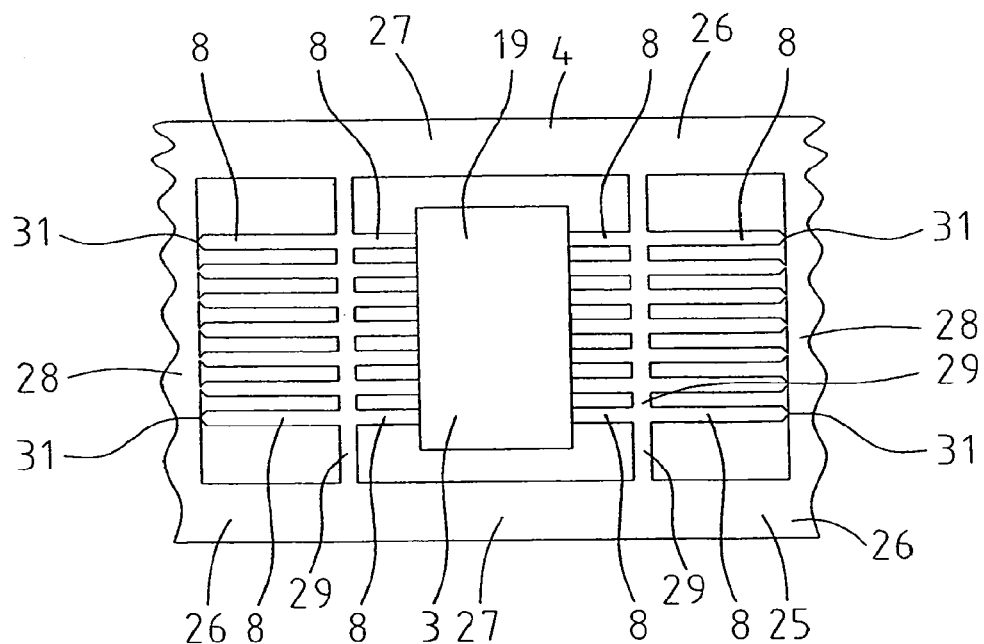
FIG. 4 is a top plan view of the portion of the semiconductor device of FIG. 3 partly assembled.

The method for producing semiconductor devices 1 will now be described with reference to FIGS. 3 to 22. A strip 24, see FIGS. 3 and 11, of leadframes 4 is fed from a magazine 39 containing a stack (not shown) of the strips 24 of leadframes 4, and is fed into a first assembly station 40, see FIG. 12, where the carrier pads 3 are sequentially bonded to the leadframes 4 of the strip 24. The strip 24 of leadframes 4 is fed over a heated platen 42, which raises the temperature of the leadframes 4 as they pass over the heated platen 42 to a temperature just above the thermosetting cure temperature of approximately 200° C. of the first adhesive 20 on the first major surface 18 of the carrier pad 3, so that when the first adhesive 20 is brought into contact with the leadframe 4 it is raised to its cure temperature for thermosetting thereof. A guillotine 43 illustrated in block representation cuts the carrier pads 3 sequentially to the appropriate size from the tape 16 which is unwound from the reel 17. The release sheet (not shown) is removed from the tape 16 as the carrier pads 3 are being cut therefrom. With the first major surface 18 of each carrier pad 3 facing downwardly, a pick-and-place mechanism 44 also illustrated in block representation in FIG. 12 sequentially transfers and places the carrier pads 3 on the respective leadframes 4 overlaying proximal portions 45 and the proximal ends 30 of the leads 8 with the first adhesive 20 abutting the proximal portions 45 and the proximal ends 30 of the leads 8, see FIG. 4.

The first adhesive 20, on coming into contact with the heated proximal portions 45 of the leads 8 of the leadframe 4 which have been raised to a temperature just above 200° C., is itself rapidly raised to its thermosetting cure temperature of approximately 200° C., and thus the first adhesive 20 rapidly cures, thereby bonding the carrier pad 3 to the proximal portions 45 and the proximal ends 30 of the leads 8 of the leadframe 4. Alternatively, the first adhesive may be only partially cured at this stage sufficient to facilitate ease of handling of the carrier pads/leadframes assembly, and if only partially cured, the first adhesive would be fully cured during curing of the second adhesive as will be described below.

This part of the assembly of the carrier pads 3 to the leadframes 4 may be carried out independently of the assembly of the dies 2 to the carrier pads 3, and if the assembly of the carrier pads 3 to the leadframes 4 is carried out independently of further assembly of the dies 2 to the carrier pads 3, it is envisaged that the strips 24 of leadframes 4 with the carrier pads 3 bonded thereto would be stacked in a suitable container (not shown) to await further assembly. If the assembly of the carrier pads 3 to the leadframes 4 is carried out independently of the remaining assembly of the dies 2 to the leadframes 4 and encapsulation of the bonded assembly 5, the assembly of the carrier pads 3 to the leadframes 4 may be carried out by a supplier of leadframes 4 who would supply the leadframes 4 with the carrier pads 3 bonded thereto in the strips 24 stacked in a suitable container (not shown). Additionally, if assembly of the carrier pads 3 and the leadframes 4 is carried out independently of the remaining assembly, in general, the first adhesive would be fully cured at this stage. However, alternatively, the entire assembly from the commencement of assembly of the carrier pads 3 to the leadframes 4 until encapsulation of the bonded assemblies 5 in the encapsulation housings 7 may be carried out on a single continuous production line. However, irrespective of whether the assembly of the carrier pads 3 to the leadframes 4 is carried out independently or otherwise of the remaining assembly, the next step in the assembly process is the application of the second adhesive 22 to the second major surface 19 of the carrier pad 3 which is carried out in a second assembly station 47 illustrated in FIG. 13.

Figure 5:
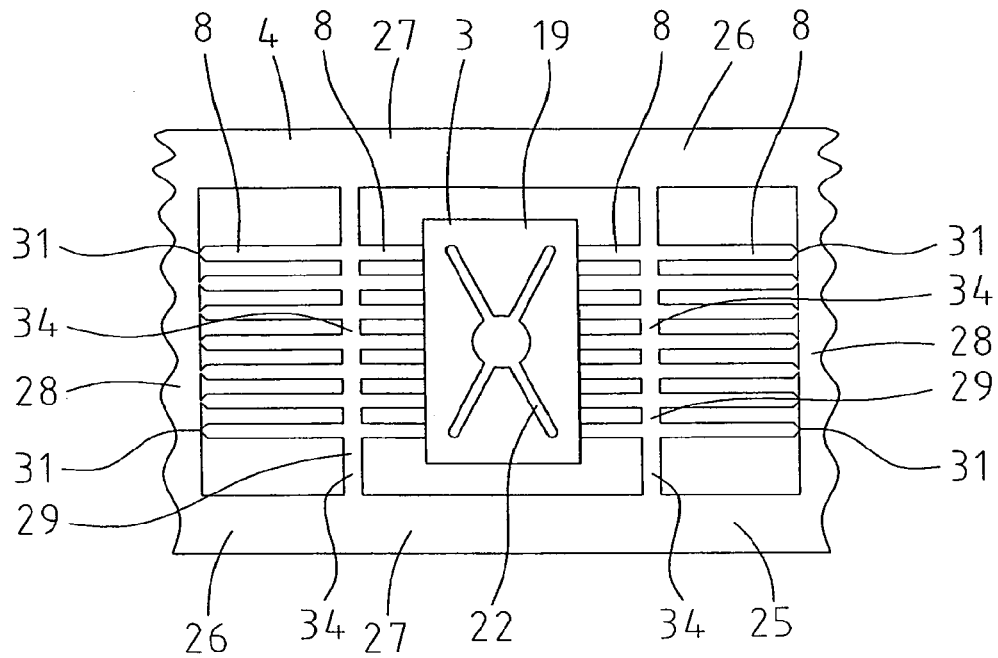
FIG. 5 is a top plan view of the portion of the semiconductor device of FIG. 3 also partly assembled.
Figure 6:
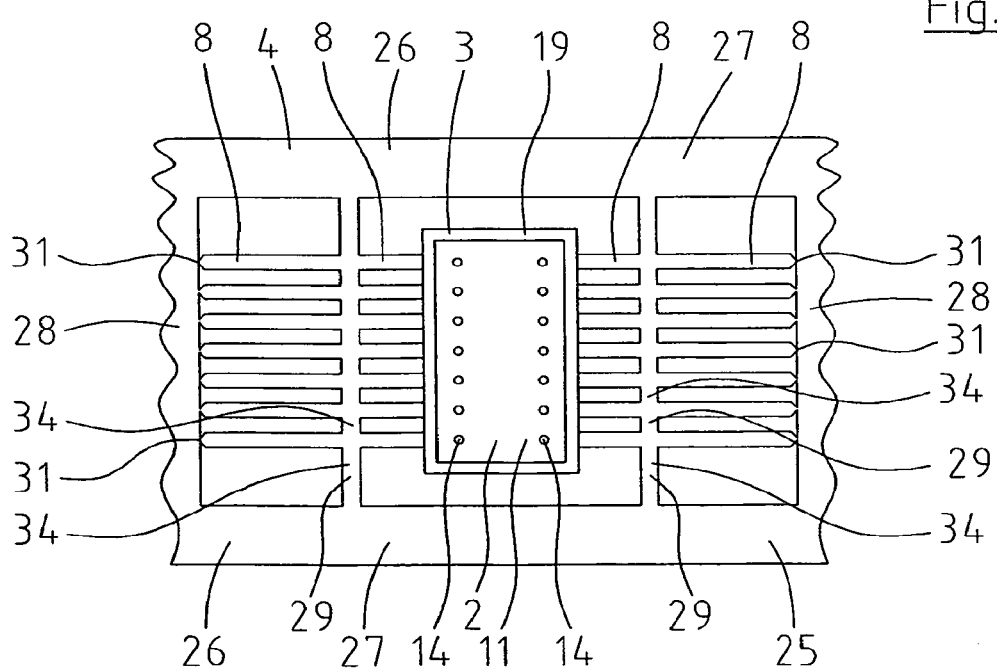
FIG. 6 is a top plan view of the portion of the semiconductor device of FIG. 3 also partly assembled.
Figure 7:
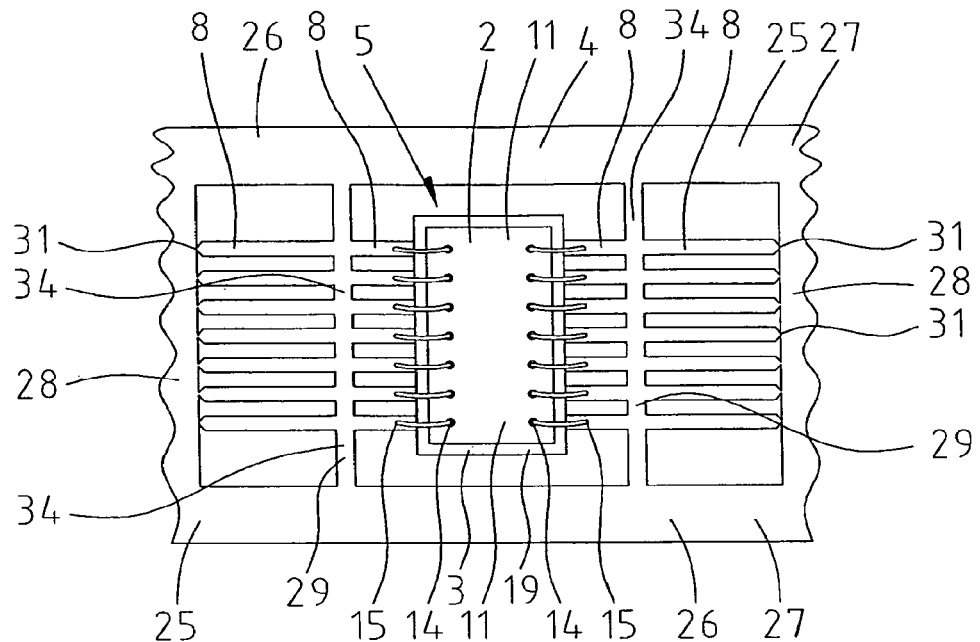
FIG. 7 is a top plan view of the portion of the semiconductor device of FIG. 3 also partly assembled.

Referring now to FIGS. 5, 13 and 14, the strip 24 of leadframes 4 with the carrier pads 3 bonded thereto is fed through the second assembly station 47, where the second adhesive 22 is sequentially applied to the carrier pads 3 of the corresponding leadframes 4. The second adhesive 22 is a flowable adhesive, and in this case is liquid at room temperature and is dispensed from a dispenser 48 through a nozzle 49. The dispenser 48 is illustrated in block representation in FIG. 13. The second adhesive 22, as discussed above, is a non-conductive thermosetting adhesive and in this case is an epoxy adhesive sold under the trade name ABLESTIK 84-3J, and is of the type which is sufficiently viscous to hold the die 2 in place on the carrier pad 3 until cured. The thermosetting cure temperature of the second adhesive 22 is 175° C. The nozzle 49 is moveable in a common plane in X-axis and Y-axis directions for dispensing the second adhesive 22 in a pattern 50 on the second major surfaces 19 of the carrier pads 3.

Typical examples of patterns 50 in which the second adhesive 22 may be dispensed onto the second major surface 19 of each carrier pad 3 are illustrated in FIGS. 15 to 17. In FIG. 15 the pattern 50*a* comprises an "X" shaped pattern which is effectively a continuous line pattern. In this case the second adhesive 22 is continuously dispensed through the nozzle 49 as lines 51 of the second adhesive 22 are being formed on the carrier pad 3 as the nozzle 49 is being simultaneously moved in the X-axis and Y-axis directions for forming the pattern 50*a*, see FIGS. 5 and 15. In FIG. 16 the pattern 50*b* comprises a plurality of discrete dots 52 of the second adhesive 22, and the pattern 50*b* is formed by interrupting the flow of second adhesive 22 through the nozzle 49 as the nozzle 49 is being simultaneously moved in the X-axis and Y-axis directions to form the pattern 50*b*. In FIG. 17 the pattern 50*c* of the second adhesive 22 on the carrier pad 3 is formed by dispensing the second adhesive 22 through the nozzle 49 while the nozzle 49 is stationary.

Figure 18:
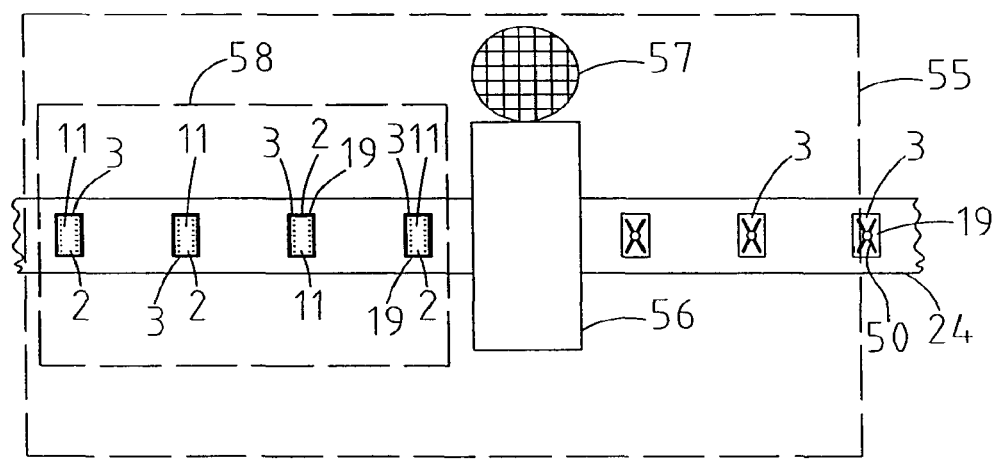
FIG. 18 is a diagrammatic top plan view of another portion of the apparatus for forming the semiconductor device of FIG. 1.

With the second adhesive 22 dispensed onto the carrier pads 3 of the strip 24 of leadframes 4, the strip 24 of leadframes 4 is fed into a third assembly station 55 where a pick-and-place mechanism 56 which is illustrated in block representation in FIG. 18 sequentially picks the dies 2 from a singulated wafer 57 which has already been cut to separate and sever the individual dies 2 from each other. The dies 2 are sequentially placed on the respective carrier pads 3 on the second adhesive 22 as the strip 24 of leadframes 4 is being fed through the third assembly station 55, see also FIGS. 6 and 10. The pick-and-place mechanism 56 urges each die 2 downwardly into engagement with the second adhesive 22, and additionally, accurately aligns each die 2 with the corresponding leadframe 4, so that contact pads 14 on the die 2 are accurately aligned with the corresponding leads 8 of the leadframe 4.

With the dies 2 accurately located in the second adhesive 22 on the carrier pads 3 of the corresponding leadframes 4, the strip 24 of leadframes 4 is fed through a curing oven 58, which is illustrated in block representation in FIG. 18 in broken lines, for raising the temperature of the second adhesive 22 to its thermosetting cure temperature of 175° C. for thermosetting the second adhesive 22, and thereby bonding the dies 2 to the carrier pads 3 aligned with the leads 8 of the corresponding leadframes 4. If the first adhesive had only been partially cured during bonding of the carrier pads 3 to the leadframes 4, the first adhesive would be fully cured at this stage by operating the curing oven 58 at a temperature sufficient to effect curing of both the first and second adhesives simultaneously. In this particular case, the curing oven 58 would be operated at a temperature of approximately 200° C. to effect simultaneous curing of the first and second adhesives.

Figure 19:
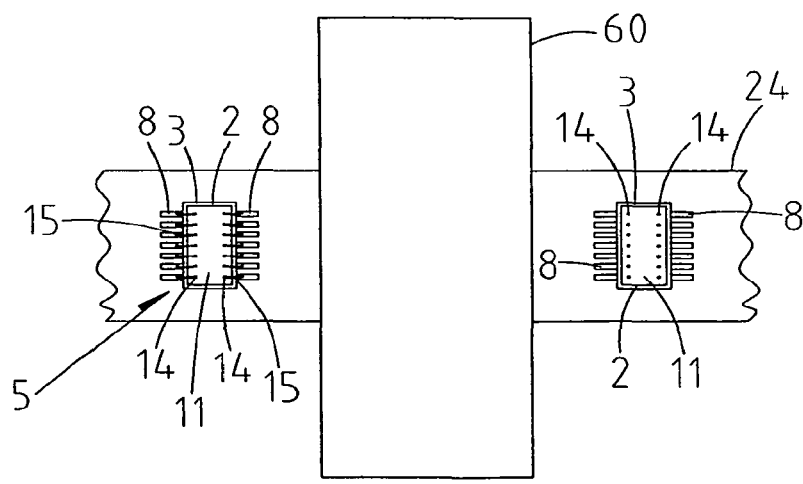
FIG. 19 is a diagrammatic top plan view of a further portion of the apparatus for forming the semiconductor device of FIG. 1.

The strip 24 of leadframes 4 with the carrier pads 3 bonded to the leadframes 4 and the dies 2 bonded to the carrier pads 3 is then fed into a fourth assembly station 60, which is illustrated in FIG. 19. In the fourth assembly station 60 the bond wires 15 are electrically coupled to the contact pads 14 of the die 2 of each bonded assembly 5 and to the corresponding leads 8 of the leadframe 4 by thermosonic welding, see FIG. 7. Thermosonic welding apparatus for coupling bond wires to contact pads of dies and to leads of leadframes will be well known to those skilled in the art.

Figure 8:
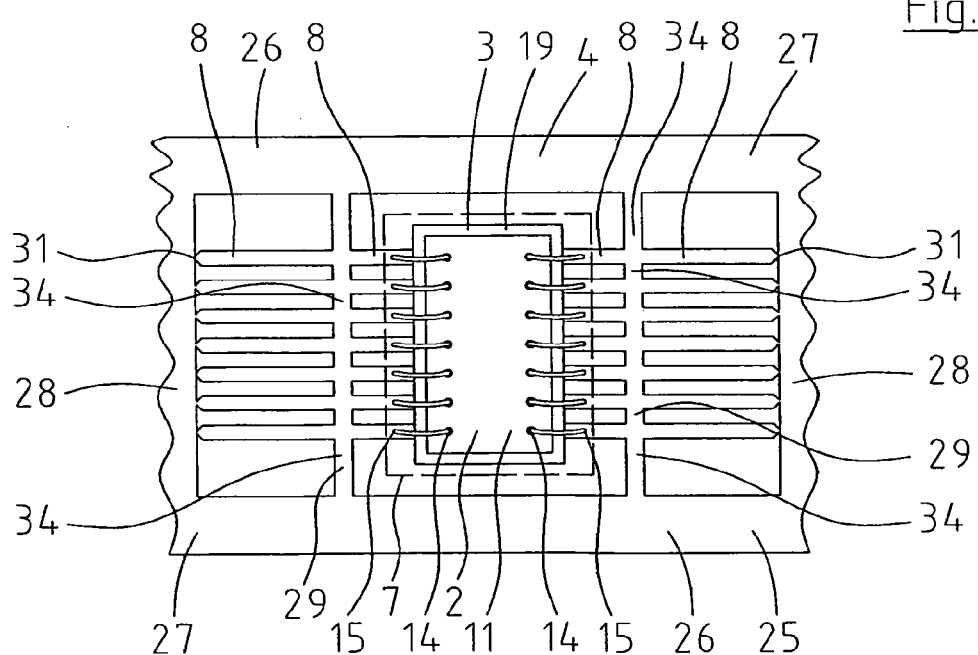
FIG. 8 is a top plan view of the portion of the semiconductor device of FIG. 3 also partly assembled.
Figure 20:
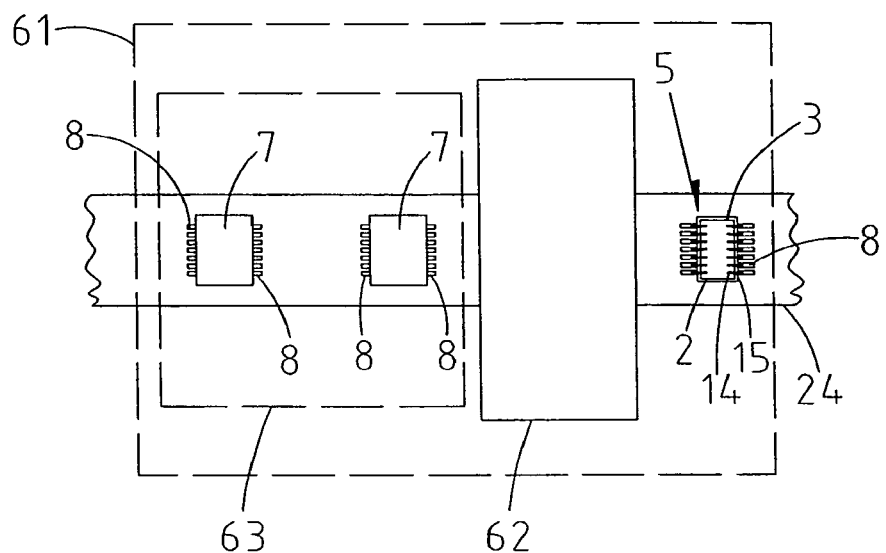
FIG. 20 is a diagrammatic top plan view of a further portion of the apparatus for forming the semiconductor device of FIG. 1.

On completion of the coupling of the bond wires 15 to the contact pads 14 and to the leads 8 of the leadframe 4 of each bonded assembly 5, the strip 24 of leadframes 4 is then fed into a fifth assembly station 61, see FIG. 20, where the bonded assemblies 5 are fed into moulding apparatus 62 for moulding the encapsulating material around the bonded assemblies 5 to form the encapsulating housings 7, see FIG. 8. The strip 24 of bonded assemblies 5 encapsulated in the encapsulating housings 7 is fed through a curing oven 63 for curing the encapsulating housings 7. In this embodiment of the invention the encapsulating material is a thermosetting material provided by a biphenyl compound, which has a cure temperature of 175° C. approximately.

Figure 21:
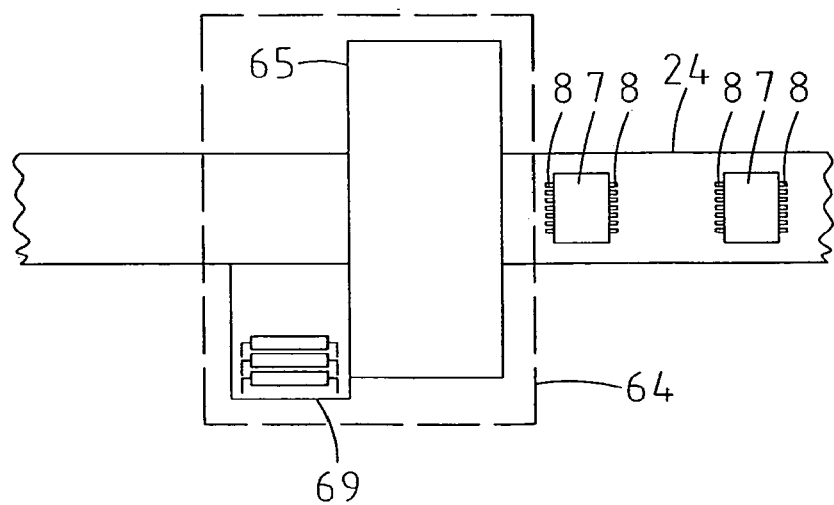
FIG. 21 is a diagrammatic top plan view of a still further portion of the apparatus for forming the semiconductor device of FIG. 1.

On curing of the encapsulating material of the encapsulating housing 7 of each semiconductor device 1, the strip 24 of leadframes 4 is advanced to a sixth assembly station 64, illustrated in FIG. 21, where a punch 65, illustrated in block representation, severs the interstices 34 of the inner transverse members 29 of the leadframes 4, which are located between the leads 8 for electrically isolating the leads 8. The punch 65 also severs the distal ends 31 of the leads 8 from the transverse members 28, and the severing of the interstices 34 adjacent the outer side members 27 severs the leads 8 from the leadframe 4, and in turn the encapsulated bonded assembly 5 is severed from the strip 24 of leadframes 4. When severing the leads 8 of each leadframe 4 from the corresponding transverse members 28, the punch 65 also cuts the leads 8 to the desired length. As the leads 8 of each leadframe 4 are being severed from the transverse members 28 and cut to length, the leads 8 are appropriately bent at 68, see FIGS. 1 and 2, to the appropriate shape so that the semiconductor device 1 is suitable for attaching to a printed circuit board or the like. The semiconductor devices are then collected in a container 69.

Figure 22:
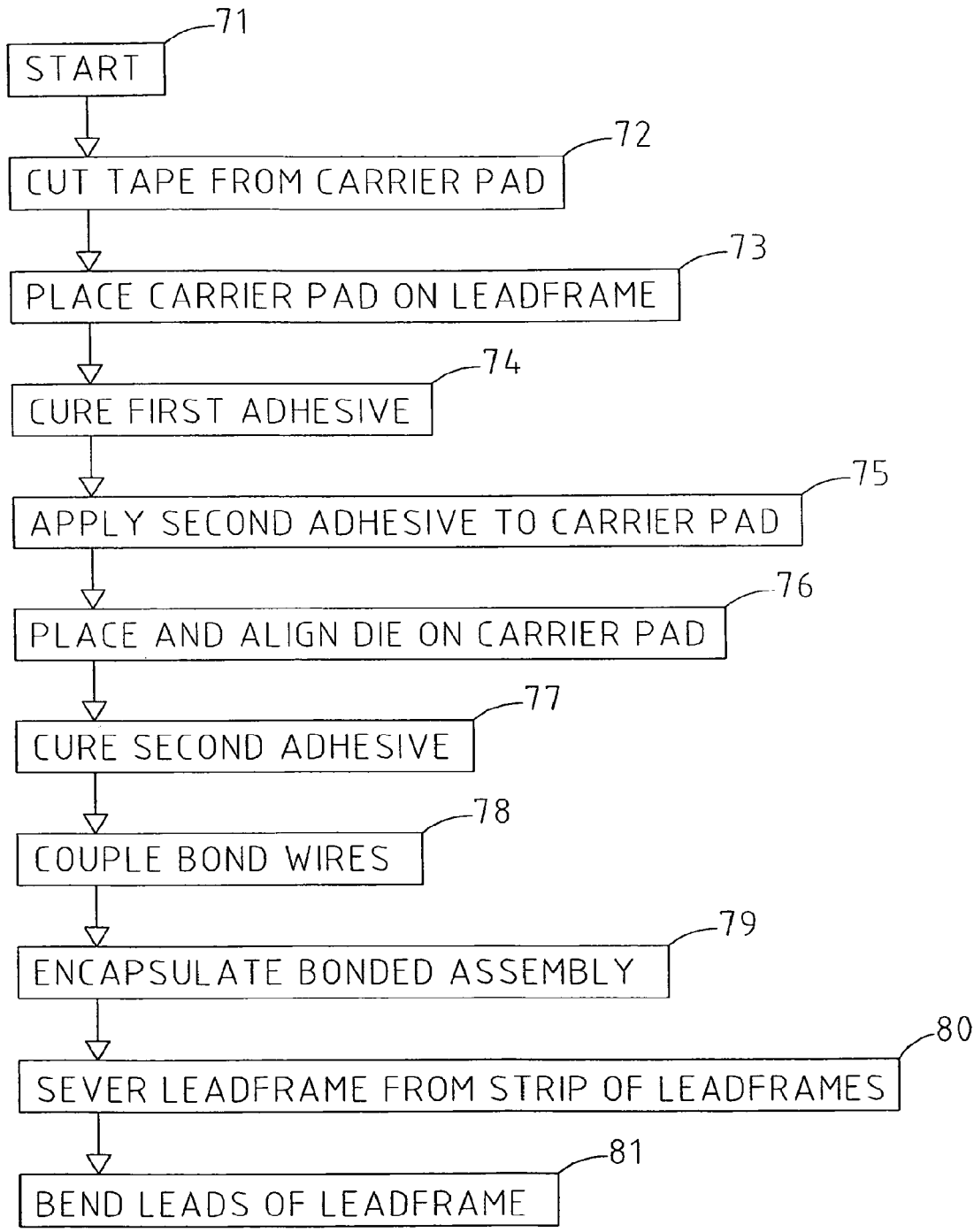
FIG. 22 is a flowchart illustrating a method according to the invention for producing the semiconductor device of FIG. 1.

Referring now to FIG. 22, there is illustrated a flowchart of the steps of the method for producing the semiconductor device 1. Block 71 starts the method, and in block 72 the carrier pad 3 is cut to size from tape 16 which is pre-coated with the first adhesive 20. In block 73 the carrier pad 3 is placed on the leadframe 4 with the first adhesive 20 on the first major surface 18 of the carrier pad 3 abutting the proximal portion 45 of the leads 8 of the leadframe 4. In block 74 the temperature of the first adhesive 20 is raised to its thermosetting cure temperature by heating the leadframe 4 for bonding the carrier pad 3 to the leadframe 4. In block 75 the second adhesive 22 is dispensed onto the second major surface 19 of the carrier pad 3. In block 76 the die 2 is placed on the second adhesive 22 and is urged into the second adhesive 22, and is accurately aligned so that the contact pads 14 are accurately aligned with the corresponding leads 8 of the leadframe 4. In block 77 the temperature of the second adhesive 22 is raised to its thermosetting cure temperature and cured for bonding the die 2 to the carrier pad 3. In block 78 the bond wires 15 are electrically coupled to the contact pads 14 and the leads 8 of the leadframe 4. In block 79 the encapsulating housing 7 is formed around the bonded assembly 5. In block 80 the interstices 34 formed by the inner transverse members 29 between the leads 8 of the leadframe 4 and between the outer side members 27 and the adjacent leads 8 are severed, and the leads 8 are severed from the outer transverse members 28 and are cut to length. In block 81 the leads 8 are bent at 68 to complete the production of the semiconductor device 1.

The dimensions of the leadframe 4 and the number of leads 8 in the leadframe 4 is determined entirely by the die 2, and the number of contact pads 14 on the die 2. The area of the carrier pad 3 in plan view is also determined by the area of the die 2 in plan view, and in general, the area of the carrier pad 3 in plan view is slightly greater than the area of the die 2 in plan view, so that margin areas 85 of the carrier pad 3 extend sidewardly beyond sides 87 of the die 2, and margin areas 86 of the carrier pad 3 extend endwardly beyond ends 88 of the die 2 respectively, see FIGS. 1 and 6. By placing the carrier pad 3 overlaying the proximal portions 45 of the leads 8 of the leadframe 4, and in turn placing the die 2 overlaying the carrier pad 3, the leads 8 act as heat sinks for conducting heat from the die 2 into the printed circuit board to which the semiconductor device 1 is electrically coupled.

The thickness of the tape forming the carrier pad may be of any suitable or desired thickness, and additionally, the depth of the first and second adhesives may be of any suitable desired depth.

While the carrier pad has been described as being cut from a specific type of tape, it will be readily apparent to those skilled in the art that the carrier pad may be cut from any other suitable tape. Additionally, it is desirable, though not essential, that the tape forming the carrier pad should be of an electrically non-conductive material, however, once the first adhesive is of an electrically non-conductive material, the carrier pad may in certain cases, if desired, be of an electrically conductive material.

The second adhesive, in general, may be electrically conductive or non-conductive. If the second adhesive is electrically conductive, it is important that the second adhesive should not spill over the edges of the carrier pad onto the leadframe. However, if the die is placed on the carrier pad with the first major surface thereof, adjacent which the integrated circuit is formed, facing downwardly towards the carrier pad, it is important that the second adhesive be electrically non-conductive.

Additionally, while the carrier pad has been described as being pre-coated with the first adhesive, it will be appreciated that this is not essential, although it is desirable. Additionally, while it is preferable, it is not essential that the first adhesive be partially cured.

While the thermosetting first and second adhesives have been described as being specific adhesives, other suitable thermosetting first and second adhesives may be used, and it is also envisaged that the first and second adhesives may have different thermosetting curing points than those described.

While the strip of leadframes illustrated in FIG. 11 has been illustrated as a single strip of leadframes, it will be appreciated that the strip of leadframes may comprise a plurality of leadframes arranged side by side, for example, two, three or four abreast of each other, and in certain cases, the leadframes may be supplied in a strip of leadframes up to twelve leadframes abreast of each other. If so, the production apparatus would be suitable for transferring the appropriate number of carrier pads and dies corresponding to the number of leadframes which are abreast of each other, and the apparatus may be provided for transferring the appropriate number of carrier pads and dies simultaneously or sequentially.

While the first and second adhesives have been described as being separately cured, the first adhesive being cured prior to dispensing the second adhesive onto the second major surface of the carrier pad, it is envisaged in certain cases that the first and second adhesives may be simultaneously cured after the die has been positioned on the carrier pad and aligned with the leads of the leadframe. Providing the first adhesive in a partially cured state would facilitate simultaneous curing of the first and second adhesives, since the first adhesive, being partially cured, would be sufficiently tacky to retain the carrier pad rigidly on the leadframe.

What is claimed is:

1. An apparatus comprising:
an electrically non-conductive carrier pad having a first major surface and a second major surface;
a leadframe bonded to the first major surface of the carrier pad by a first adhesive, wherein the first adhesive comprises a thermosetting adhesive; and
a semiconductor die bonded to the second major surface of the carrier pad by a cured second adhesive, the second adhesive being a temperature cured adhesive, and the second adhesive being flowable at room temperature pre-curing, wherein the first adhesive comprises a different material than the second adhesive, and wherein the die and the carrier pad overlay inner ends of at least some leads of the leadframe.

2. The apparatus of claim 1 in which the first adhesive is electrically non-conductive.

3. The apparatus of claim 1 in which the second adhesive is electrically non-conductive.

4. The apparatus of claim 1 in which the second adhesive comprises a thermosetting adhesive.

5. The apparatus of claim 1 in which the first adhesive has a higher cure temperature than the second adhesive.

6. The apparatus of claim 1 in which the carrier pad comprises a flexible material.

7. The apparatus of claim 1 in which the die comprises an upper surface opposite a lower surface bonded to the carrier pad, and in which the die comprises contact pads on the upper surface that are wire bonded to the leadframe.

8. The apparatus of claim 1 further comprising a printed circuit board electrically coupled to a semiconductor device, the semiconductor device comprising the semiconductor die.

9. A semiconductor device comprising:
a carrier pad having first and second major surfaces;
a leadframe bonded to the first major surface of the carrier pad by a first adhesive, wherein the first adhesive comprises a thermosetting adhesive; and
a semiconductor die bonded to the second major surface of the carrier pad by a cured second adhesive, the second adhesive being a temperature curable adhesive that is flowable at room temperature pre-curing, wherein the first adhesive comprises a different material than the second adhesive, and wherein the die and the carrier pad overlay inner ends of at least some leads of the leadframe.

10. The semiconductor device of claim 9 in which the second adhesive comprises an electrically non-conductive thermosetting adhesive.

11. The semiconductor device as claimed in claim 9 in which the carrier pad comprises polyimide material.

12. The semiconductor device of claim 9 in which the first adhesive comprises an electrically non-conductive thermosetting adhesive.

13. The semiconductor device of claim 9 in which the area of the carrier pad in plan view is substantially similar to the area of the die in plan view.

14. The semiconductor device of claim 9 in which the die has a lower surface and an upper surface opposite the lower surface, the lower surface bonded to the second major surface of the carrier pad, and the die comprising contact pads on the upper surface that are wire bonded to the leadframe.

15. The semiconductor device of claim 9 in which the die, the carrier pad and the leadframe bonded together are encapsulated in an encapsulating housing of a moldable thermosetting material, and in which outer ends of respective leads of the leadframe extend from the encapsulating housing.

16. The semiconductor device of claim 9 in which the second adhesive is a thermosetting adhesive having a cure temperature that is lower than a cure temperature of the first adhesive.

17. The semiconductor device of claim 9 in which the second adhesive has a cure temperature selected from the range of about 80° C. to 250° C.

18. The semiconductor device of claim 17 in which the first adhesive has a cure temperature selected from the range of about 120° C. to 250° C.

19. The semiconductor device of claim 9 in which the leads of the leadframe are configured to function as heat sinks.

* * * * *